(12) United States Patent
Grodzki (10) Patent No.: US 10,698,058 B2
(45) Date of Patent: Jun. 30, 2020

(54) METHOD AND APPARATUS FOR OPTIMIZING GRADIENT PULSES OF A PULSE SEQUENCE FOR A MAGNETIC RESONANCE APPARATUS

(71) Applicant: Siemens Healthcare GmbH, Erlangen (DE)

(72) Inventor: David Grodzki, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 91 days.

(21) Appl. No.: 15/902,478

(22) Filed: Feb. 22, 2018

(65) Prior Publication Data

US 2018/0238985 A1 Aug. 23, 2018

(30) Foreign Application Priority Data

Feb. 22, 2017 (DE) .......................... 10 2017 202 874

(51) Int. Cl.
| | |
|---|---|
| *G01R 33/54* | (2006.01) |
| *G01R 33/56* | (2006.01) |
| *G01R 33/561* | (2006.01) |
| *G01R 33/385* | (2006.01) |

(52) U.S. Cl.
CPC ......... *G01R 33/543* (2013.01); *G01R 33/546* (2013.01); *G01R 33/561* (2013.01); *G01R 33/5608* (2013.01); *G01R 33/385* (2013.01); *G01R 33/3854* (2013.01)

(58) Field of Classification Search
CPC .......................... G01R 33/543; G01R 33/561; G01R 33/5608; G01R 33/546; G01R 33/3854; G01R 33/385
See application file for complete search history.

(56) References Cited

U.S. PATENT DOCUMENTS

| | | | |
|---|---|---|---|
| 2013/0200893 A1 | 8/2013 | Heismann et al. | |
| 2014/0232396 A1* | 8/2014 | Grodzki ............... | G01R 33/543 324/309 |
| 2014/0232397 A1* | 8/2014 | Grodzki ............... | G01R 33/543 324/309 |

(Continued)

OTHER PUBLICATIONS

Grodzki, "Verbesserte lineare Gradientenoptimierung unter Einhaltung bzw. Ermittlung von maximalen Gradientenamplituden für leise bzw. stromsparende MRI," Siemens AG publication 7678537 (2014).

*Primary Examiner* — G. M. A Hyder
(74) *Attorney, Agent, or Firm* — Schiff Hardin LLP (57) ABSTRACT

In a method magnetic resonance apparatus, a pulse sequence is optimized in order to identify a time interval of the pulse sequence during which gradient pulses are modifiable, and subdividing that time interval into two time subintervals wherein, during one of these two time subintervals, no gradient pulse is activated. Such an optimized pulse sequence can be repeated in a number of repetitions, during which magnetic resonance data are acquired, with a contiguous gradient being activated between repetitions, that performs the role of a conventional spoiler occurring directly before an RF excitation the contiguous gradient occurs during a duration that is shorter than a time directly following acquisition of data in one repetition and before excitation in the next repetition.

20 Claims, 4 Drawing Sheets

(56) References Cited

U.S. PATENT DOCUMENTS

| | | | |
|---|---|---|---|
| 2015/0108981 A1* | 4/2015 | Grodzki | G01R 33/3671 |
| | | | 324/318 |
| 2015/0160317 A1* | 6/2015 | Grodzki | G01R 33/543 |
| | | | 702/57 |
| 2015/0241536 A1* | 8/2015 | Grodzki | G01R 33/543 |
| | | | 324/309 |
| 2017/0176561 A1 | 6/2017 | Grodzki | |

* cited by examiner

FIG 1

FIG 2   Stand der Technik

FIG 4

METHOD AND APPARATUS FOR OPTIMIZING GRADIENT PULSES OF A PULSE SEQUENCE FOR A MAGNETIC RESONANCE APPARATUS

BACKGROUND OF THE INVENTION

Field of the Invention

The present invention concerns optimizing a pulse sequence for a magnetic resonance apparatus, wherein the gradient pulses of the pulse sequence are optimized.

Description of the Prior Art

For the acquisition of MR data with a magnetic resonance (MR) apparatus, a pulse sequence is played out. Gradient coils, with which the gradient pulses of the pulse sequence are generated, are frequently and rapidly switched. Since the time stipulations within a pulse sequence must be observed exactly and the overall duration of a pulse sequence substantially determines the overall duration of the MRI examination, gradient field strengths of 40 mT/m, and a rise rate of 200 mT/m/ms, are used. Particularly the high rise rates lead to a high noise level during the MRI examination. In addition, the high rise rates lead to a relatively high energy usage and place relatively heavy demands on the gradient coils and the hardware connected thereto. The rapidly changing magnetic field gradients lead to distortions and oscillations in the gradient coils and to the transference of these energies to the housing of the magnetic resonance apparatus. Finally, due a heating of the gradient coils and the other components, a high level of helium boil-off can occur in MR scanners that have a helium-cooled superconducting magnet that generates the basic magnetic field.

In order to prevent these problems, sometimes with known methods of the prior art for optimizing the gradient pulses, temporally very long gradient sequences arise which, although they lead to no noise burden, load the gradient system severely.

SUMMARY OF THE INVENTION

An object of the present invention is to provide a pulse sequence with which the gradient pulses are optimized such that the problems described above do not occur.

In the context of the present invention, a method for optimizing a pulse sequence for a magnetic resonance system has the following steps.

A pulse sequence is provided to computer, the pulse sequence having one or more RF pulses and gradient pulses in temporal relation thereto. For example, a pulse sequence that has previously been generated can be read into the computer.

The acquired pulse sequence is analyzed in the computer in order to determine one or more time intervals of the pulse sequence during which the gradient pulses may be modified. In other words, the pulse sequence can be subdivided into two types of time intervals. In a first type of time interval, the current values of the gradients or gradient pulses must remain unmodified so that the gradients can fulfil their intended function. Among this first type of time interval is, for example, the time intervals during which slice selection gradients or gradients are activated during the readout times. By contrast, during a time interval of the second type, the gradient pulses are modified. In a time interval of the second type, what is important is only that the gradient pulse has a pre-determined amplitude at the beginning and/or at the end of the time interval and that the gradient pulses generate a particular gradient moment during the time interval. In other words, the gradient pulse shapes can be modified during the second type of time interval, taking account of the aforementioned boundary conditions without the function of the pulse sequence being modified thereby. The second type of time intervals are also denoted below as modifiable time intervals.

At least one modifiable time interval is modified while at least one of the modifiable time intervals is divided into at least two time subintervals. During at least one of these at least two time subintervals, no gradient pulse is activated. Differently expressed, when the pulse sequence has only a modifiable time interval, that modifiable time interval is subdivided into the previously described at least two time subintervals. If, however, the pulse sequence has a number of modifiable time intervals, at least one of these modifiable time intervals is optimized by dividing it into the at least two time subintervals described above.

Control signals corresponding to the modified pulse sequence are generated in the computer, and are emitted to the MR apparatus, or the scanner thereof, in order to operate the MR apparatus or scanner so as to acquire MR signals (MR data) from a subject.

Through the optimization, the time span of the respective modifiable time interval itself is not modified. Furthermore, the amplitude of the gradient pulse at the beginning of the modifiable time interval and the amplitude of the gradient pulse at the end of the modifiable time interval is advantageously also not modified by the optimization.

The inventive optimization of the pulse sequence enables the utilization of particularly quiet, gradient coil-sparing and rapidly realizable gradient pulses (the inventive optimization of the gradient shape can effectively be carried out during the transfer of the pulse sequence for execution), in particular, during relatively long modifiable time intervals.

According to a preferred inventive embodiment, a time interval of the pulse sequence is determined as a modifiable time interval only if that time interval is longer than a pre-determined time interval threshold value (e.g. 25 ms) and if, during that time interval, a gradient pulse that generates a gradient moment is switched (activated).

According to this embodiment, the gradient shape is optimized for a time interval only if that time interval has a particular duration. Furthermore, it must not be a time interval during which no gradient is activated.

According to a further preferred embodiment, a time interval of the pulse sequence is determined as a modifiable time interval only if a mean gradient amplitude calculated through the gradient moment to be generated during that time interval, and the duration of that time interval, are each less than respective pre-determined threshold values. The mean gradient amplitude or the amplitude value G can be calculated as:

$$G = \mathrm{abs}(M/t) \qquad (1)$$

wherein M represents the gradient moment to be generated during the time interval, and t is the duration of the time interval. The threshold value can be, for example, 2 mT/m.

During the step of optimizing the at least one modifiable time interval, it is specified at which time point a so-called "zero-moment subinterval", during which no gradient pulse is activated, begins, and at which time point this zero-moment subinterval ends. In a similar way, during the optimization, it is specified at which time point a so-called "moment subinterval", during which one or more gradient pulses are activated, begins and at which time point the moment subinterval ends. According to the invention, for each modifiable time interval to be optimized, the following variants can be implemented.

In one such variant, both at the beginning and at the end of the modifiable time interval, according to the pulse sequence to be optimized (i.e. according to the starting situation), no gradient pulse is active. In this variant, the modifiable time interval is subdivided into exactly two time subintervals, specifically a zero-moment subinterval and a moment subinterval, so that the total of the durations of the two time subintervals corresponds to the duration of the modifiable time interval. The time point at which the zero-moment subinterval begins can correspond to the time point at which the modifiable time interval begins, so that in this case, the moment subinterval ends at the same time point as the modifiable time interval. However, the inverse case is also possible, that the time point at which the moment subinterval begins corresponds to the time point at which the modifiable time interval begins, so that the zero-moment subinterval ends at the same time point as the modifiable time interval.

In another variant, both at the beginning and at the end of the modifiable time interval, according to the pulse sequence to be optimized, a gradient pulse is active. In this variant, the modifiable time interval is subdivided into exactly three time subintervals, specifically a zero-moment subinterval and two moment subintervals, so that the total of the durations of the three time subintervals corresponds to the duration of the modifiable time interval. The first moment subinterval begins at the same time point as the modifiable time interval, wherein a gradient pulse of this first moment subinterval at the beginning of the first moment subinterval has the same amplitude as the gradient pulse at the beginning of the modifiable time interval according to the pulse sequence to be optimized. The second moment subinterval ends at the same time point as the modifiable time interval, wherein a gradient pulse of this second moment subinterval at the end of the second moment subinterval has the same amplitude as the gradient pulse at the end of the modifiable time interval according to the pulse sequence to be optimized. Thus the zero-moment subinterval lies between the first and second moment subinterval.

In another variant, at the beginning of the modifiable time interval, according to the pulse sequence to be optimized, a gradient pulse is active, while at the end of the modifiable time interval, according to the pulse sequence to be optimized, no gradient pulse is active. In this variant, the modifiable time interval is subdivided into exactly two time subintervals, specifically a zero-moment subinterval and a moment subinterval, so that the total of the durations of the two time subintervals corresponds to the duration of the modifiable time interval. The moment subinterval begins at the same time point as the modifiable time interval, wherein a gradient pulse of this moment subinterval at the beginning of the moment subinterval has the same amplitude as the gradient pulse at the beginning of the modifiable time interval according to the pulse sequence to be optimized. The zero-moment subinterval ends at the same time point as the modifiable time interval.

In another variant, at the beginning of the modifiable time interval, according to the pulse sequence to be optimized, no gradient pulse is active, while at the end of the modifiable time interval, according to the pulse sequence to be optimized, a gradient pulse is active. In this variant, the modifiable time interval is subdivided into exactly two time subintervals, specifically a zero-moment subinterval and a moment subinterval, so that the total of the durations of the two time subintervals corresponds to the duration of the modifiable time interval. The moment subinterval ends at the same time point as the modifiable time interval, wherein a gradient pulse of this moment subinterval at the end of the moment subinterval has the same amplitude as the gradient pulse at the end of the modifiable time interval according to the pulse sequence to be optimized. The zero-moment subinterval begins at the same time point as the modifiable time interval.

In all the variants, a desired moment which is generated by the gradient pulses that are activated during the respective modifiable time interval of the pulse sequence to be optimized, are generated exactly by the gradient pulse or pulses that are activated during the moment subinterval or subintervals according to the optimized pulse sequence. In other words, in the event that the modifiable time interval is subdivided into exactly one zero-moment subinterval and exactly one moment subinterval, the desired moment is generated by the gradient pulse or pulses that are activated during this one moment subinterval. In the event that the modifiable time interval is subdivided into exactly one zero-moment subinterval and exactly two moment subintervals, the desired moment is generated by the gradient pulses that are activated during these two moment subintervals.

For the configuration of the gradient shape of a moment subinterval, the following possibilities exist according to the invention.

A first option is to set the duration of the moment subinterval according to a pre-determined duration (e.g. 20 ms). Based upon this pre-determined duration, the gradient shape of the moment subinterval which creates the desired moment is then constructed. Herein, boundary conditions such as, for example, a gradient amplitude at the beginning or the end of the moment subinterval are taken into account.

Another option is, based on a pre-determined gradient amplitude change rate or slew rate (e.g. 10 mT/m/ms) and/or based on pre-determined maximum gradient amplitude (e.g. 10 mT/m), the gradient shape of the moment subinterval that creates the desired moment is constructed (designed). Based upon this gradient shape that is thereby constructed, the duration of the moment subinterval is determined, by which the duration of the associated zero-moment subinterval is also determined.

In the variant in which the modifiable time interval is subdivided into three time subintervals, in the first of the two moment subintervals, the gradient is ramped down with a pre-determined shape (e.g. with a pre-determined gradient amplitude rate of change). The resulting gradient moment of this first moment subinterval can then be subtracted from the desired moment that is to be realized overall, through which a further desired moment results. The gradient shape of the second moment subinterval is then constructed, for example, on the basis of the possibilities described above, so that the gradient shape constructed for the second moment subinterval generates the further desired moment, by which the gradient shape of the first and second moment subinterval together produce the desired moment.

In the variant in which the modifiable time interval is subdivided into three time subintervals, the desired moment that is to be realized overall can also be divided, as desired, into a first desired moment for the first of the two moment subintervals and into a second desired moment for the second of the two moment subintervals, so that the first and second target moment together produce the desired moment that is to be realized.

In the context of the present invention, in a method for acquiring MR data with a magnetic resonance apparatus, multiple repetitions of a pulse sequence are executed, in particular, of a spin echo sequence. The pulse sequence has at least one RF pulse and corresponding gradient pulses.

MR data are acquired while the repetitions are inserted.

These two steps by themselves, are conventional for acquiring MR data with a magnetic resonance apparatus.

In accordance with the invention, following the acquisition of the MR data (i.e. following the last readout), during a first repetition of the pulse sequence and before the radiation of the RF excitation pulse of the second repetition directly following this first repetition, a contiguous gradient is activated. This contiguous gradient has the same effects as a spoiler that is conventionally activated directly following the acquisition of the MR data of the first repetition, as well as the same effects as a spoiler that is conventionally activated directly before the radiation of the RF excitation pulse of the second repetition. According to the invention, the contiguous gradient is activated during a particular time interval that is shorter (e.g. by more than 50%) than the time interval that begins directly following the acquisition of the MR data of the first repetition and ends at the beginning of the radiation of the RF excitation pulse of the second repetition.

In other words, the inventive pulse sequence functions without the aforementioned usual two non-contiguous gradients according to the prior art (i.e., a first spoiler directly following the acquisition of the MR data and a second spoiler directly before the radiation of the RF excitation pulse), and instead functions with only one (contiguous) gradient that provides the same effects as the two usual spoilers according to the prior art. A "contiguous gradient" means a gradient that has a gradient shape in which no time interval occurs during which the gradient is not activated.

With the inventive combination of the effects of two spoilers known from the prior art into a contiguous gradient, the gradient shape of this contiguous gradient can be set better, so that an optimum noise reduction is achieved, with the lowest possible current consumption.

The pulse sequence used in the method described above is a pulse sequence that is optimized according to the inventive method described initially.

The contiguous gradient is activated before the beginning of the radiation of the RF excitation pulse of the second repetition in order to transition without a pause into the selection gradient for the RF excitation pulse of the second repetition.

In other words, in this variant of the inventive pulse sequence, only one (contiguous) gradient exists, which performs the following functions (partially temporally sequentially):

Spoiler following the acquisition of the MR data,
Spoiler before the irradiation of the HF excitation pulse,
Selection gradient of the HF excitation pulse The present invention also encompasses a magnetic resonance apparatus that is configured to operate with a pulse sequence having at least one RF pulse and gradient pulses or gradients in temporal relation thereto. The inventive magnetic resonance apparatus has a computer and an image sequence controller. The computer is configured to analyze the pulse sequence (provided thereto) in order to determine one or more modifiable time intervals of the pulse sequence and to optimize at least one of these modifiable time intervals. For optimization, the respective modifiable time interval is divided into at least two time subintervals, wherein, during one of these at least two time subintervals, no gradient pulse is activated. The image sequence controller is configured to acquire MR data with the optimized pulse sequence.

The advantages of the inventive magnetic resonance apparatus essentially correspond to the advantages of the above-described inventive method for optimizing a pulse sequence, as described in detail above.

The present invention also encompasses a magnetic resonance apparatus that configured to acquire MR data with a pulse sequence. This magnetic resonance apparatus has an image sequence controller configured to activate multiple repetitions of the pulse sequence, in order to acquire MR data. The image sequence controller is further configured, following the acquisition of the MR data on the basis of one of these repetitions and before a radiation of an RF excitation pulse of a further repetition directly following this repetition, to activate a contiguous gradient, which performs the role both of a spoiler directly following the acquisition of the MR data of the repetition as well as the role of a spoiler directly before the radiation of the RF excitation pulse of the further repetition. Furthermore, the image sequence controller is configured to activate the contiguous gradient during a particular time interval, this particular time interval being shorter than a time interval that begins directly following the acquisition of the MR data of the repetition and ends at the beginning of the radiation of the HF excitation pulse of the further repetition.

The advantages of the further magnetic resonance system essentially correspond to the advantages of the inventive method for acquiring MR data, as also set out in detail above.

The present invention also encompasses a non-transitory, computer-readable data storage medium encoded with programming instructions that, when the storage medium is loaded into a computer or computer system of a magnetic resonance apparatus, cause the computer or computer system to operate the magnetic resonance apparatus in order to implement any or all of the methods described above, and any or all embodiments thereof.

The electronically readable data carrier can be, for example, a DVD, a magnetic tape, a hard disk drive or a USB stick, on which electronically readable control information, in particular software (see above), is stored.

DESCRIPTION OF THE PREFERRED EMBODIMENTS

Figure 1:
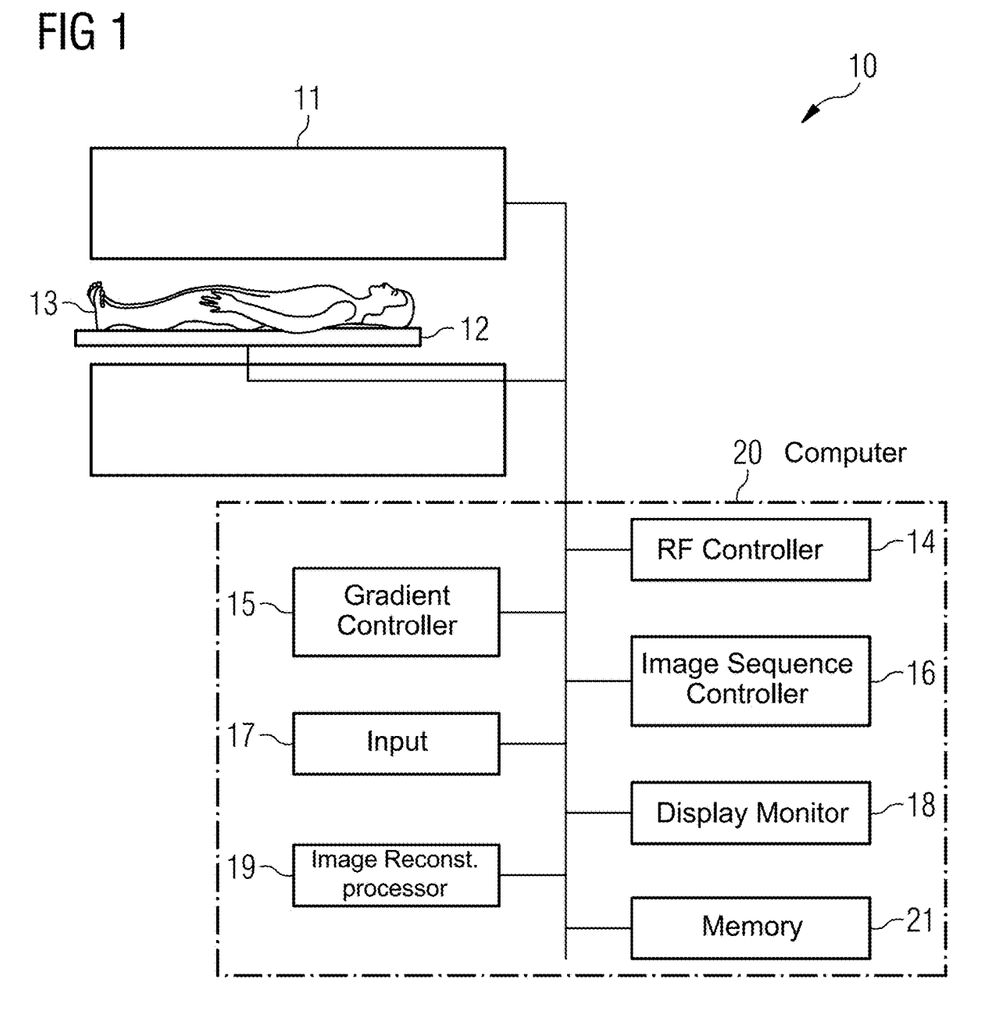
FIG. 1 schematically illustrates an inventive magnetic resonance apparatus.

FIG. 1 shows a magnetic resonance apparatus 10 with which, as described below, MR data are acquired and MR images are generated. The MR apparatus 10 has an MR data acquisition scanner 11 that has a magnet that generates a polarization field BO, wherein an examination subject 13 on a support 12 is moved into the scanner 11 in order to record position-encoded magnetic resonance signals from the subject 13. The RF coils used for signal detection, such as a whole body coil or local coils are not shown for clarity. By radiation of radio frequency energy and switching (activation) of magnetic field gradients, the magnetization of certain nuclear spins in the subject 13, created by the polarization field BO is deflected out of the equilibrium position and MR signals emitted by those nuclear spins are spatially encoded, and the resultant magnetization is detected by the receiving RF coils. The manner by which MR signals are acquired and ultimately MR images are created through the radiation of RF pulses and the switching of magnetic field gradients in different combinations and sequences is known to those skilled in the art, and need not be described in greater detail herein.

The MR apparatus 10 further has a control computer 20 that controls the MR apparatus 10. The control computer 20 has a gradient controller 15 for the control and switching of the necessary magnetic field gradients or gradient pulses. An RF controller 14 is provided for the control and generation of the RF pulses for deflecting the magnetization. An image sequence controller 16 controls the sequence of the magnetic field gradients and RF pulses, and thus indirectly the gradient controller 15 and the RF controller 14. Via an input unit 17, a technician can operate the MR apparatus 10 system and, on a display monitor 18, the MR images and other information necessary for the operation can be displayed. The computer 20 has at least one processor circuit (not shown) for controlling the different components in the control computer 20. Furthermore, a memory 21 is provided in which, for example, program modules or programs can be stored that, when they are executed by the computer 20 or its processor, control the operation of the apparatus 10. The computer 20 includes an image reconstruction processor 19 that reconstruction MR image data from the acquired MR signals or MR data. The MR image data can be presented as an image of the subject 13 at the display monitor 18.

Figure 4:
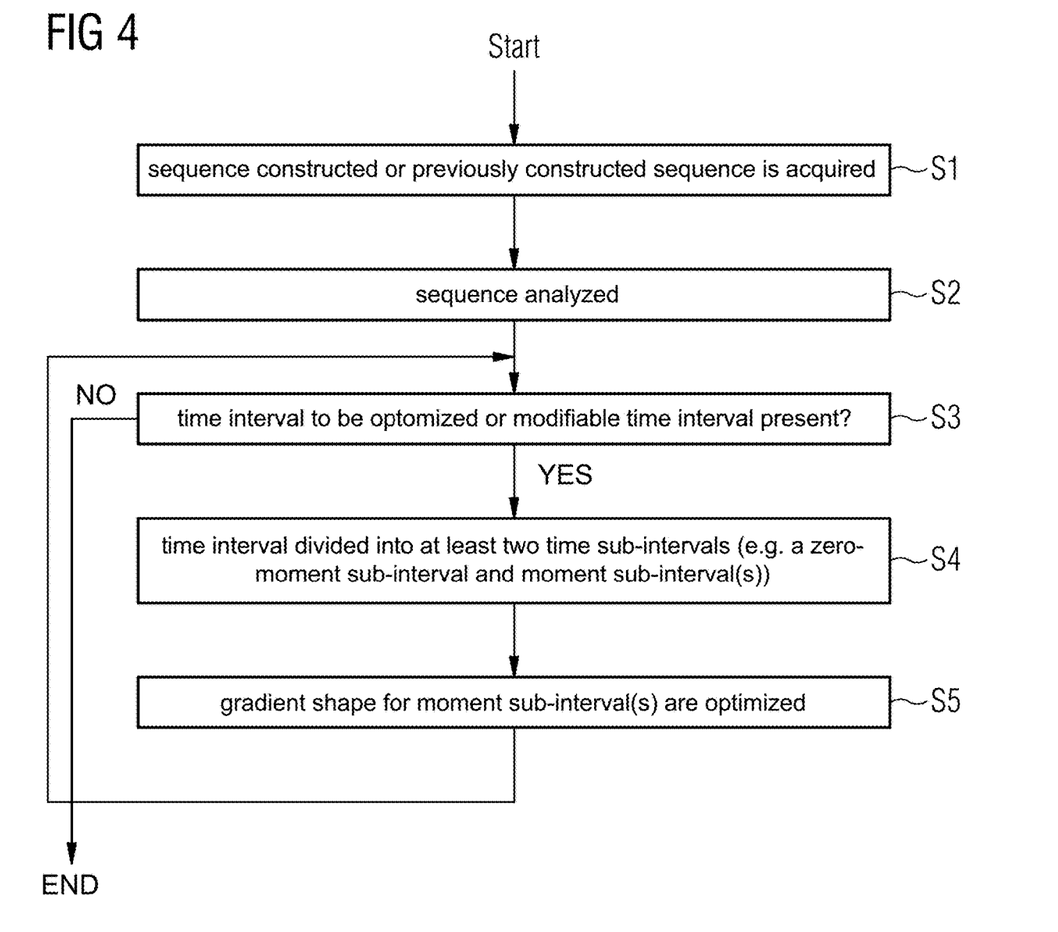
FIG. 4 is a flowchart of the inventive method for optimizing gradient pulses of a pulse sequence.

The steps described in relation to FIG. 4 can be carried out by the computer 20. For this purpose, the MR apparatus 10 can access a program module or instructions that are provided in the memory 21, and which, upon execution by the computer 20, cause the steps described above to be implemented.

Figure 2:
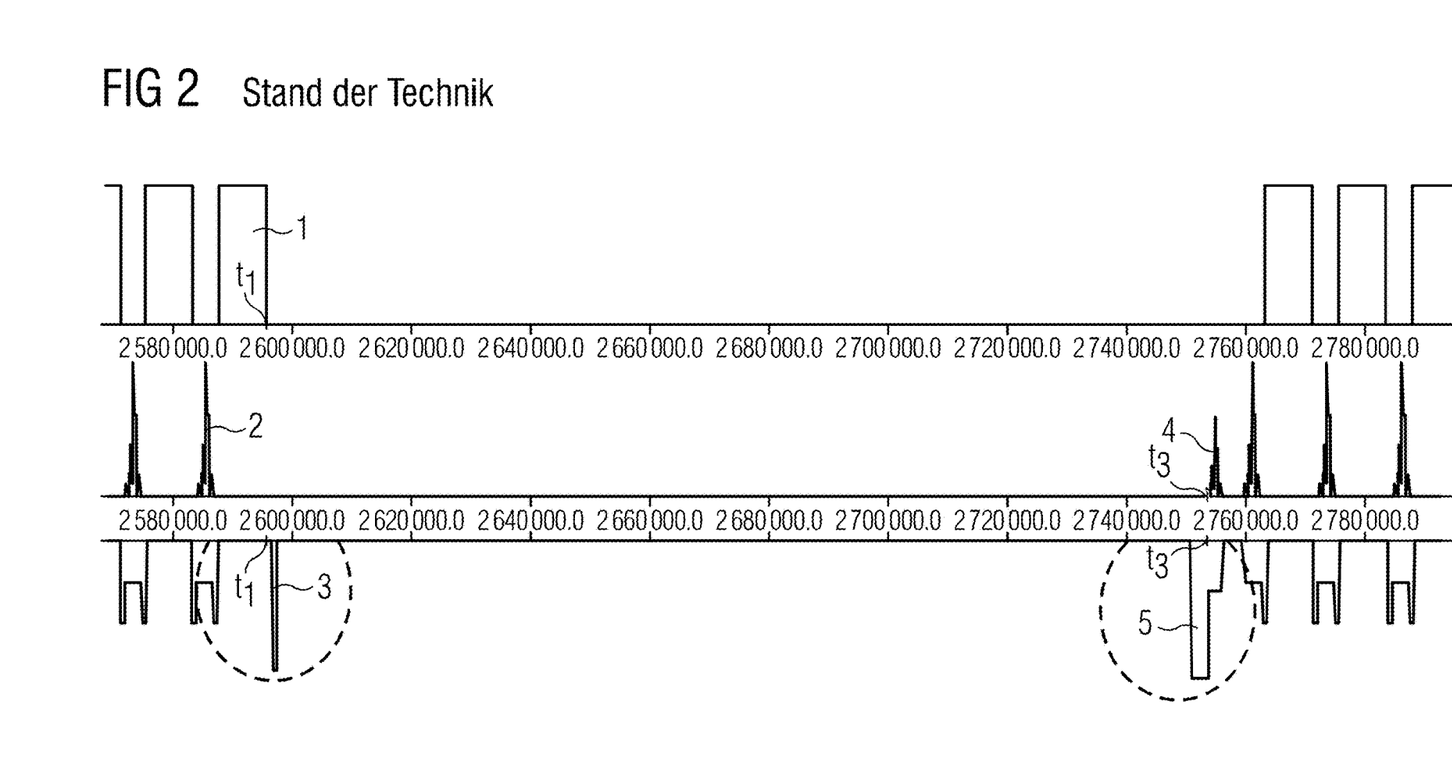
FIG. 2 shows a spin echo pulse sequence according to the prior art.

FIG. 2 is a spin echo pulse sequence known according to the prior art.

At the end of a first repetition, an RF refocusing pulse 2 is radiated before MR data are acquired during a scanning interval 1. Shortly after the time point $t_1$ which coincides with the end of the scanning interval 1, a spoiler gradient 3 is activated in order to eliminate the transverse magnetization of the first repetition.

At the time point $t_3$, radiation of the RF excitation pulse 4 for the next or second repetition is begun. Before the time point $t_3$, a further spoiler gradient 5 is switched in order to eliminate the transverse magnetization of the first repetition as fully as possible. This spoiler 5 transitions at the time point $t_3$ into the slice selection gradient, which has no reference sign of its own in FIG. 2.

Figure 3:
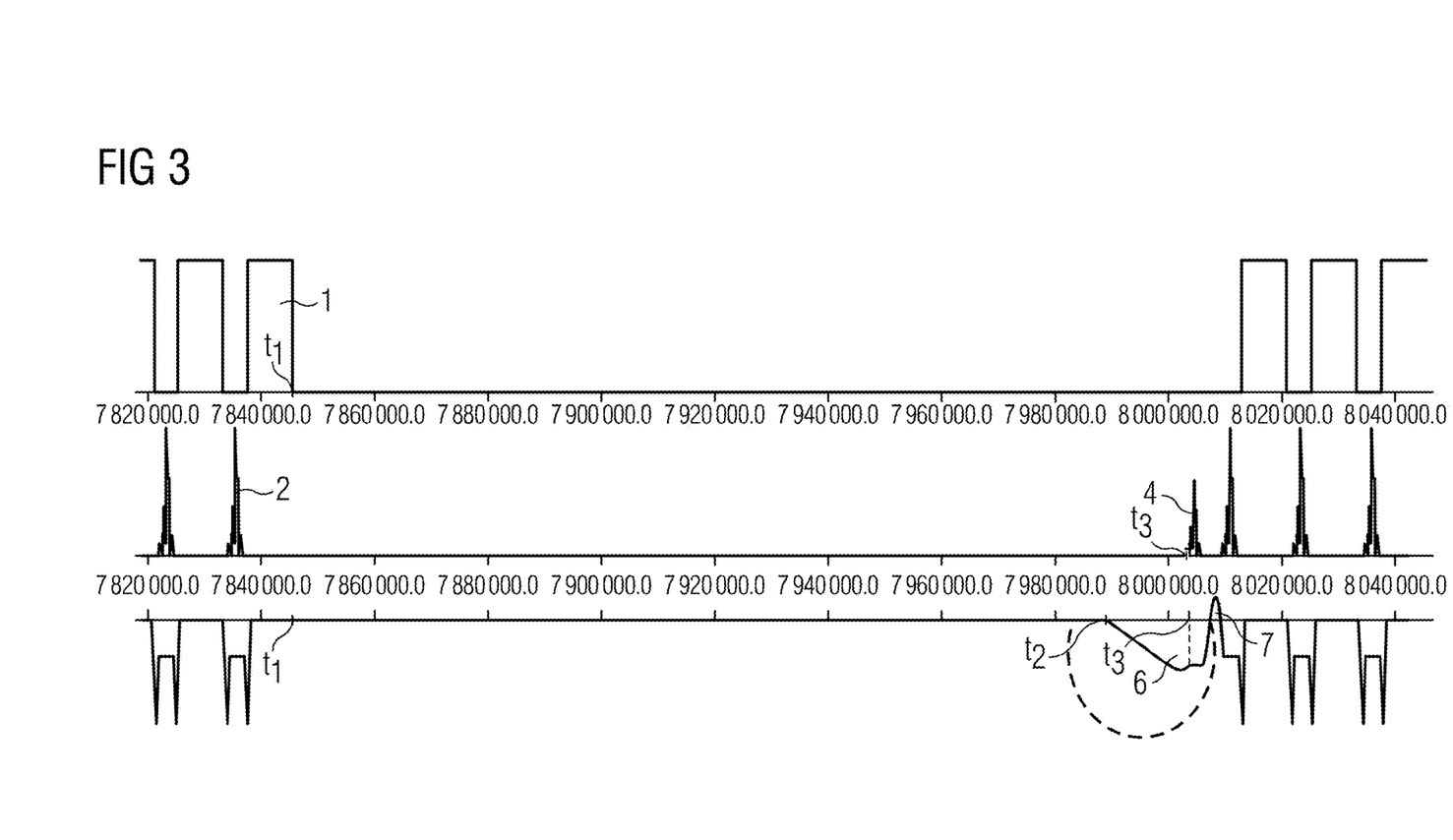
FIG. 3 shows an inventive pulse sequence that is an improvement over the pulse sequence shown in FIG. 2.

In FIG. 3, an inventive spin echo pulse sequence is shown, which starts from the pulse sequence shown in FIG. 2 through an optimization of the spoilers 3 and 5.

In the inventive pulse sequence, the spoiler 3 and the spoiler 5 have been combined into the gradient pulse 6. For this purpose, the pulse sequence shown in FIG. 2 is analyzed in the computer 20 and it has been found that the time interval from the time point $t_1$ to the time point $t_3$ is a so-called "modifiable" time interval during which the gradient shape of the gradients 3 and 5 may be optimized. An analysis of the time interval $t_1$-$t_3$ shows that the gradient moment at the time point $t_1$ is equal to zero and the gradient moment at the time point $t_3$ is unequal to zero. Therefore, the time interval $t_1$-$t_3$ is divided into exactly two time subintervals, the first time subinterval corresponding to a so-called "zero-moment subinterval" $t_1$-$t_2$, during which no gradient is switched. By contrast, the second time subinterval $t_2$-$t_3$ is a moment subinterval during which a gradient is inserted such that the moment generated by the gradient corresponds to a gradient moment which the gradients 3, 5 inserted during the modifiable time interval $t_1$-$t_3$ of the pulse sequence to be optimized generate.

The gradient shape of the gradient 6 begins at the time point $t_2$ at which the second time subinterval or moment subinterval $t_2$-$t_3$ begins, with a pre-determined gradient amplitude change rate or slew rate. Shortly after a quantitative gradient amplitude maximum value, the gradient shape falls to a moment value at the time point $t_3$ which corresponds to the moment value of the gradient shape of the original spoiler 5 at the time point $t_3$. At the time point $t_3$ there follows the slice selection gradient 7 which has also been optimized in terms of its gradient shape as compared with the slice selection gradient in FIG. 2.

FIG. 4 is a flowchart of the inventive method for optimizing a spin echo pulse sequence.

In the first step S1, a sequence is constructed or a previously constructed sequence is acquired. This sequence is analyzed in the following step S2. If it is recognized in the following step S3 that a time interval still to be optimized or a modifiable time interval exists in the pulse sequence, the process branches to step S4, otherwise the process ends.

In step S4, the respective modifiable time interval is divided into at least two time subintervals. More precisely stated, the respectively modifiable time interval is divided into a zero-moment subinterval and one or two moment subintervals. Subsequently, the gradient shape for one or both moment subintervals is optimized such that the respective gradient can be inserted in as quiet and energy-saving a manner as possible. Following step S5, the process jumps back to step S3 to check whether a further time interval to be optimized is present in the pulse sequence.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for operating a magnetic resonance apparatus with an optimized pulse sequence, said method comprising:

providing a computer with a pulse sequence that operates a magnetic resonance apparatus, said pulse sequence comprising at least one radio frequency (RF) pulse, and gradient pulses in temporal relation to said at least one RF pulse;

in said computer, analyzing said pulse sequence in order to determine at least one time interval of the pulse sequence during which the gradient pulses are modifiable;

in said computer, optimizing said at least one time interval by subdividing said at least one time interval into two time subintervals such that, during one of said two time subintervals, no gradient pulse is activated, and thereby obtaining an optimized pulse sequence; and in said computer, generating control signals corresponding to the optimized pulse sequence and emitting said control signals to said magnetic resonance apparatus in order to operate the magnetic resonance apparatus so as to acquire magnetic resonance data from a subject, wherein optimizing said at least one time interval further comprises, in said computer:
(a) checking whether, at a beginning of said at least one time interval, no gradient pulse is active and whether, at an end of said time interval, a gradient pulse is active;
if checking in (a) is positive, beginning a zero-moment time subinterval in said at least one time interval, said zero-moment time subinterval having a duration during which no gradient pulse is activated, at a beginning of said at least one time interval;
(b) checking whether, at said beginning of said at least one time interval, a gradient pulse is active and whether, at said end of said at least one time interval, no gradient pulse is active; and
if said checking in (b) is positive, making said zero-moment time subinterval end at the end of said at least one time interval.

2. A method as claimed in claim 1 comprising determining said at least one time interval as being a time interval during which the gradient pulses are modifiable only if that time interval is longer than a pre-determined time duration and only if, during that time interval, a gradient pulse is activated that generates a gradient moment.

3. A method as claimed in claim 1 comprising determining said at least one time interval of said pulse sequence as being a time interval during which the gradient pulses are modifiable, only if a mean value of an amplitude of a gradient that is activated during that time interval is less than a pre-determined threshold value, said amplitude mean value being determined dependent on a gradient moment that is generated during that time interval and a duration of that time interval.

4. A method as claimed in claim 1 wherein optimizing said at least one time interval further comprises, in said computer:
checking whether, both at a beginning of said at least one time interval and at an end of said at least one time interval, no gradient pulse is active; and
if said check is positive, beginning a zero-moment time subinterval in said at least one time interval, said zero-moment time subinterval having a duration during which no gradient pulse is activated, with said zero-moment time subinterval beginning at said beginning of said at least one time interval or said zero-moment time subinterval ending at said end of said at least one time interval.

5. A method as claimed in claim 1 wherein optimizing said at least one time interval comprises, in said computer:
checking whether both at a beginning of said at least one time interval and at an end of said at least one time interval, a gradient pulse is active;
if said check is positive, dividing said at least one time interval into three time subintervals; and
beginning a first of said three time subintervals at the beginning of said at least one time interval with a moment value that the active gradient pulse has at said beginning of said at least one time interval and ending with a moment value of zero, and following said first of said three time subintervals with a second of said three time subintervals, with said second of said three time subintervals corresponding to a zero-moment time subinterval during which no gradient pulse is activated, and directly following said second of said three time subintervals with a third of said three time subintervals, in said third of said three time subintervals beginning with a moment value of zero and ending with a moment value at an end of said at least one time interval that the active gradient pulse has at said beginning of said at least one time interval.

6. A method as claimed in claim 1 wherein a total duration of said time subintervals corresponds to a duration of said at least one time interval.

7. A method as claimed in claim 1 wherein said at least one time interval has a desired gradient moment that is generated by gradient pulses that are active during said at least one time interval in said pulse sequence before optimizing, said desired moment being a sum of individual moments respectively generated by individual gradient pulses that are activated during said time subintervals of said at least one time interval, and designating a time subinterval, during which a gradient pulse is active, as a moment time subinterval, so that said at least one time interval comprises exactly one moment time subinterval, or exactly two moment time subintervals, with the desired moment being generated following said optimizing either exactly during said moment time subinterval or exactly during said two moment time intervals.

8. A method as claimed in claim 7 wherein, when said at least one time interval has exactly two moment time subintervals, dividing said desired moment of said at least one time interval into a desired moment of one moment time subinterval and a desired moment of the other moment time subinterval or, during a temporally first moment time subinterval, ramping the moment down to zero with a pre-determined shape starting from the moment value that the active gradient pulse has at the beginning of said at least one time interval in said pulse sequence before optimizing, and wherein the desired moment of the other moment time subinterval corresponds to a different of the desired moment of the at least one time interval and the moment generated during the first moment time subinterval, or, during a temporally second moment time subinterval, ramping the moment up with a pre-determined shape from zero to the moment value that the active gradient pulse has at an end of said at least one time interval in the pulse sequence before optimizing, and wherein the desired moment of the other moment time subinterval corresponds to a difference of the desired moment of the at least one time interval and the moment generated during the second moment time subinterval.

9. A method as claimed in claim 7 wherein a duration of the moment time subinterval is pre-determined and, dependent on said duration, determining a moment shape of the moment subinterval in order to generate the desired moment of the moment subinterval.

10. A method as claimed in claim 7 wherein a moment shape of the moment subinterval is determined from at least one of a pre-determined gradient amplitude change rate, and a pre-determined maximum gradient amplitude.

11. A method for operating a magnetic resonance apparatus comprising a radio frequency (RF) antenna and a gradient coil arrangement, said method comprising:
in a computer, generating control signals corresponding to a pulse sequence that has been optimized via the method according to claim 1, and emitting said control signals to a magnetic resonance apparatus in order to operate the magnetic resonance apparatus so as to execute a plurality of repetitions of said pulse sequence, and so as to acquire MR data while said repetitions are repeated;
in said computer, following acquisition of MR data from a first of said repetitions, and before operating said RF antenna to radiate an RF excitation pulse of a second of said repetitions that directly follows said first of said repetitions, emitting control signals to said magnetic resonance apparatus that cause said gradient coil arrangement to activate a contiguous gradient, which performs both a role of a spoiler directly following acquisition of said magnetic resonance data of said first of said repetitions and a role of a spoiler directly before radiation of said RF excitation pulse of said second of second repetitions, said control signals emitted by said computer causing said contiguous gradient to be activated during a time interval that is shorter than a time interval that begins directly following acquisition of said magnetic resonance data of said first of said repetitions and at least at a beginning of radiation of said RF excitation pulse of said second of said repetitions.

12. A method as claimed in claim 11 comprising generating control signals in said computer, and emitting said control signals to said magnetic resonance apparatus, that cause said radiant coil arrangement to be operated so that said contiguous gradient is activated before said beginning of radiation of the RF excitation pulse of said second of said repetitions, and to transition without pause into a selection gradient that is activated during radiation of the RF excitation pulse of said second of said repetitions.

13. A method as claimed in claim 11 comprising generating said control signals in said computer in order to execute a plurality of repetitions of a spin echo sequence, as said plurality of repetitions of said pulse sequence.

14. A magnetic resonance apparatus comprising:
a magnetic resonance data acquisition scanner; and
a computer provided with a pulse sequence that operates said magnetic resonance data acquisition scanner, said pulse sequence comprising at least one radio frequency (RF) pulse, and gradient pulses in temporal relation to said at least one RF pulse, wherein said computer is configured to:
analyze said pulse sequence in order to determine at least one time interval of the pulse sequence during which the gradient pulses are modifiable;
optimize said at least one time interval by subdividing said at least one time interval into two time subintervals such that, during one of said two time subintervals, no gradient pulse is activated, and thereby obtain an optimized pulse sequence; and
generate control signals corresponding to the optimized pulse sequence and to emit said control signals to said magnetic resonance data acquisition scanner in order to operate the magnetic resonance data acquisition scanner so as to acquire magnetic resonance data from a subject,
wherein optimizing said at least one time interval further comprises:
(a) checking whether, at a beginning of said at least one time interval, no gradient pulse is active and whether, at an end of said time interval, a gradient pulse is active;
if checking in (a) is positive, beginning a zero-moment time subinterval in said at least one time interval, said zero-moment time subinterval having a duration during which no gradient pulse is activated, at a beginning of said at least one time interval;
(b) checking whether, at said beginning of said at least one time interval, a gradient pulse is active and whether, at said end of said at least one time interval, no gradient pulse is active; and if said checking in (b) is positive, making said zero-moment time subinterval end at the end of said at least one time interval.

15. A magnetic resonance apparatus comprising:
a magnetic resonance data acquisition scanner comprising a radio frequency (RF) antenna and a gradient coil arrangement; and
a computer configured to generate control signals corresponding to a pulse sequence including at least one RF pulse and gradient pulses in temporal relation to said at least one RF pulse, and to emit said control signals to said magnetic resonance data acquisition scanner in order to operate the magnetic resonance data acquisition scanner so as to execute a plurality of repetitions of said pulse sequence, and so as to acquire MR data while said repetitions are repeated, wherein: said pulse sequence is analyzed by said computer in order to determine at least one time interval of the pulse sequence during which the gradient pulses are modifiable, said at least one time interval is optimized by subdividing said at least one time interval into two time subintervals such that, during one of said two time subintervals, no gradient pulse is activated, and thereby obtaining an optimized pulse sequence, and the generated control signals correspond to the optimized pulse sequence;
said computer, following acquisition of MR data from a first of said repetitions, and before operating said RF antenna to radiate an RF excitation pulse of a second of said repetitions that directly follows said first of said repetitions, being configured to emit control signals to said magnetic resonance data acquisition scanner that cause said gradient coil arrangement to activate a contiguous gradient, which performs both a role of a spoiler directly following acquisition of said magnetic resonance data of said first of said repetitions and a role of a spoiler directly before radiation of said RF excitation pulse of said second of said repetitions, said control signals emitted by said computer causing said contiguous gradient to be activated during a time interval that begins directly following acquisition of said magnetic resonance data of said first of said repetitions and at least at a beginning of radiation of said RF excitation pulse of said second of said repetitions.

16. A non-transitory, computer-readable data storage medium encoded with programming instructions, said storage medium being loaded into a computer of a magnetic resonance apparatus, and said programming instructions causing said computer to:
receive a pulse sequence that operates said magnetic resonance apparatus, said pulse sequence comprising at least one radio frequency (RF) pulse, and gradient pulses in temporal relation to said at least one RF pulse;
analyze said pulse sequence in order to determine at least one time interval of the pulse sequence during which the gradient pulses are modifiable;
optimize said at least one time interval by subdividing said at least one time interval into two time subintervals such that, during one of said two time subintervals, no gradient pulse is activated, and thereby obtaining an optimized pulse sequence; and
generate control signals corresponding to the optimized pulse sequence and emit said control signals to said magnetic resonance apparatus in order to operate the magnetic resonance apparatus so as to acquire magnetic resonance data from a subject, wherein optimizing said at least one time interval further comprises:

(a) checking whether, at a beginning of said at least one time interval, no gradient pulse is active and whether, at an end of said time interval, a gradient pulse is active;

if checking in (a) is positive, beginning a zero-moment time subinterval in said at least one time interval, said zero-moment time subinterval having a duration during which no gradient pulse is activated, at a beginning of said at least one time interval;

(b) checking whether, at said beginning of said at least one time interval, a gradient pulse is active and whether, at said end of said at least one time interval, no gradient pulse is active; and if said checking in (b) is positive, making said zero-moment time subinterval end at the end of said at least one time interval.

17. A non-transitory, computer-readable data storage medium encoded with programming instructions, said storage medium being loaded into a computer of a magnetic resonance apparatus comprising a radio frequency (RF) antenna and a gradient coil arrangement, said programming instructions causing said computer to:

generate control signals corresponding to a pulse sequence including at least one RF pulse and gradient pulses in temporal relation to said at least one RF pulse, and emitting said control signals to a magnetic resonance apparatus in order to operate the magnetic resonance apparatus so as to execute a plurality of repetitions of said pulse sequence, and so as to acquire MR data while said repetitions are repeated, wherein: said pulse sequence is analyzed by said computer in order to determine at least one time interval of the pulse sequence during which the gradient pulses are modifiable, said at least one time interval is optimized by subdividing said at least one time interval into two time subintervals such that, during one of said two time subintervals, no gradient pulse is activated, and thereby obtaining an optimized pulse sequence, and the generated control signals correspond to the optimized pulse sequence; and following acquisition of MR data from a first of said repetitions, and before operating said RF antenna to radiate an RF excitation pulse of a second of said repetitions that directly follows said first of said repetitions, emit control signals to said magnetic resonance apparatus that cause said gradient coil arrangement to activate a contiguous gradient, which performs both a role of a spoiler directly following acquisition of said magnetic resonance data of said first of said repetitions and a role of a spoiler directly before radiation of said RF excitation pulse of said second of said repetitions, said control signals emitted by said computer causing said contiguous gradient to be activated during a time interval that begins directly following acquisition of said magnetic resonance data of said first of said repetitions and at least at a beginning of radiation of said RF excitation pulse of said second of said repetitions.

18. A method for operating a magnetic resonance apparatus with an optimized pulse sequence, said method comprising:

providing a computer with a pulse sequence that operates a magnetic resonance apparatus, said pulse sequence comprising at least one radio frequency (RF) pulse, and gradient pulses in temporal relation to said at least one RF pulse;

in said computer, analyzing said pulse sequence in order to determine at least one time interval of the pulse sequence during which the gradient pulses are modifiable;

in said computer, optimizing said at least one time interval by subdividing said at least one time interval into two time subintervals such that, during one of said two time subintervals, no gradient pulse is activated, and thereby obtaining an optimized pulse sequence; and in said computer, generating control signals corresponding to the optimized pulse sequence and emitting said control signals to said magnetic resonance apparatus in order to operate the magnetic resonance apparatus so as to acquire magnetic resonance data from a subject, wherein optimizing said at least one time interval comprises, in said computer:

checking whether both at a beginning of said at least one time interval and at an end of said at least one time interval, a gradient pulse is active;

if said check is positive, dividing said at least one time interval into three time subintervals; and beginning a first of said three time subintervals at the beginning of said at least one time interval with a moment value that the active gradient pulse has at said beginning of said at least one time interval and ending with a moment value of zero, and following said first of said three time subintervals with a second of said three time subintervals, with said second of said three time subintervals corresponding to a zero-moment time subinterval during which no gradient pulse is activated, and directly following said second of said three time subintervals with a third of said three time subintervals, in said third of said three time subintervals beginning with a moment value of zero and ending with a moment value at an end of said at least one time interval that the active gradient pulse has at said beginning of said at least one time interval.

19. A method for operating a magnetic resonance apparatus with an optimized pulse sequence, said method comprising:

providing a computer with a pulse sequence that operates a magnetic resonance apparatus, said pulse sequence comprising at least one radio frequency (RF) pulse, and gradient pulses in temporal relation to said at least one RF pulse;

in said computer, analyzing said pulse sequence in order to determine at least one time interval of the pulse sequence during which the gradient pulses are modifiable;

in said computer, optimizing said at least one time interval by subdividing said at least one time interval into two time subintervals such that, during one of said two time subintervals, no gradient pulse is activated, and thereby obtaining an optimized pulse sequence; and in said computer, generating control signals corresponding to the optimized pulse sequence and emitting said control signals to said magnetic resonance apparatus in order to operate the magnetic resonance apparatus so as to acquire magnetic resonance data from a subject, wherein said at least one time interval has a desired gradient moment that is generated by gradient pulses that are active during said at least one time interval in said pulse sequence before optimizing, said desired moment being a sum of individual moments respectively generated by individual gradient pulses that are activated during said time subintervals of said at least one time interval, and designating a time subinterval, during which a gradient pulse is active, as a moment time subinterval, so that said at least one time interval comprises exactly one moment time subinterval, or exactly two moment time subintervals, with the desired moment being generated following said optimizing either exactly during said moment time subinterval or exactly during said two moment time intervals.

20. A method as claimed in claim 19 wherein, when said at least one time interval has exactly two moment time subintervals, dividing said desired moment of said at least one time interval into a desired moment of one moment time subinterval and a desired moment of the other moment time subinterval or, during a temporally first moment time subinterval, ramping the moment down to zero with a pre-determined shape starting from the moment value that the active gradient pulse has at the beginning of said at least one time interval in said pulse sequence before optimizing, and wherein the desired moment of the other moment time subinterval corresponds to a different of the desired moment of the at least one time interval and the moment generated during the first moment time subinterval, or, during a temporally second moment time subinterval, ramping the moment up with a pre-determined shape from zero to the moment value that the active gradient pulse has at an end of said at least one time interval in the pulse sequence before optimizing, and wherein the desired moment of the other moment time subinterval corresponds to a difference of the desired moment of the at least one time interval and the moment generated during the second moment time subinterval.

\* \* \* \* \*